(12) United States Patent
Wu et al.

(10) Patent No.: US 10,802,366 B2
(45) Date of Patent: Oct. 13, 2020

(54) DISPLAY PANEL AND DISPLAY DEVICE

(71) Applicant: XIAMEN TIANMA MICRO-ELECTRONICS CO., LTD., Xiamen (CN)

(72) Inventors: Huangyao Wu, Xiamen (CN); Tianyuan Chen, Xiamen (CN); Qian Yang, Xiamen (CN); Boping Shen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 127 days.

(21) Appl. No.: 15/863,964

(22) Filed: Jan. 7, 2018

(65) Prior Publication Data

US 2018/0129111 A1 May 10, 2018

(30) Foreign Application Priority Data

Aug. 21, 2017 (CN) .......................... 2017 1 0718395

(51) Int. Cl.
*G02F 1/1362* (2006.01)
*G06F 3/041* (2006.01)
(Continued)

(52) U.S. Cl.
CPC .... *G02F 1/136286* (2013.01); *G02F 1/13338* (2013.01); *G02F 1/13454* (2013.01); *G06F 3/0412* (2013.01); *G06F 3/0416* (2013.01); *G09G 3/20* (2013.01); *G09G 3/3648* (2013.01); *H01L 27/124* (2013.01); *G02F 1/1368* (2013.01); *G02F 2201/56* (2013.01);
(Continued)

(58) Field of Classification Search
CPC ........... G02F 1/136286; G02F 1/13338; G02F 1/13454; G02F 1/1368; G09G 3/3648; G09G 3/041; G09G 2300/0426; G09G 2310/08; H01L 27/124
See application file for complete search history.

(56) References Cited

U.S. PATENT DOCUMENTS

2017/0110041 A1* 4/2017 Watsuda ................... G09G 3/20
2018/0040291 A1* 2/2018 Wu ......................... G09G 5/003
(Continued)

FOREIGN PATENT DOCUMENTS

CN 104732908 A 6/2015
KR 20160017869 A 2/2016

*Primary Examiner* — Stephen G Sherman
(74) *Attorney, Agent, or Firm* — Kilpatrick Townsend & Stockton, LLP

(57) ABSTRACT

Disclosed are a display panel and a display device. The display panel includes a plurality of first signal lines and a plurality of second signal lines extending to a peripheral special shaped area, and a first multiplexer, a second multiplexer and a plurality of main lines arranged in the peripheral special shaped area. The plurality of first signal lines and the plurality of second signal lines are connected in the one-to-one correspondence by the first multiplexer, the plurality of main lines and the second multiplexer in the peripheral special shaped area. Different first signal lines and corresponding second signal lines connected to the same main line may be turned on in sequence according to the set timings by controlling the switch timings of the switch elements of the first multiplexer and the second multiplexer.

17 Claims, 12 Drawing Sheets

(51) Int. Cl.
*G09G 3/36* (2006.01)
*G09G 3/20* (2006.01)
*G02F 1/1333* (2006.01)
*G02F 1/1345* (2006.01)
*H01L 27/12* (2006.01)
*G02F 1/1368* (2006.01)

(52) U.S. Cl.
CPC ......... *G06F 3/041* (2013.01); *G09G 2300/04* (2013.01); *G09G 2300/0426* (2013.01); *G09G 2310/0281* (2013.01); *G09G 2310/08* (2013.01)

(56) References Cited

U.S. PATENT DOCUMENTS

2018/0190190 A1\* 7/2018 Xi ........................ G09G 3/3225
2018/0204889 A1\* 7/2018 Yu ........................ G09G 3/3233

\* cited by examiner

DISPLAY PANEL AND DISPLAY DEVICE

This application claims the benefit of Chinese Patent Application No. CN 201710718395.2, filed with the Chinese Patent Office on Aug. 21, 2017, which is hereby incorporated by reference in its entirety.

FIELD OF INVENTION

The present disclosure relates to the field of display technologies and particularly to a display panel and a display device.

BACKGROUND

At present the screen of a common display device, e.g., a display, a television, a mobile phone, a tablet or the like, is generally a regular rectangle.

With the development of the science and technology, the demand for the screen of the display device by people is increasingly diversified. The shape of the display panel is often designed to be a shape other than the regular rectangle, such as convex polygon, concave polygon, circle, ring or the like. Such the display panel is commonly referred as the special shaped display panel. The special shaped display panel may make the shape of the screen of the display device present diversified designs, which may be applied in products such as advertising presentation screens, information indicating screens, on-vehicle display screens, smart watches, smart bands, VR/AR glasses. It has a wide range of usage. Moreover the shape design of the special shaped display panel may further keep off some function modules, e.g., web camera modules, sensor modules, or speaker modules or the like, on the frontal panel of the display device, thereby increasing the screen occupation ratio of the display device and make the display effect more outstanding.

BRIEF SUMMARY

Embodiments of the disclosure are to provide a display panel and a display device so as to reduce the width size of the peripheral special shaped area of the display panel, enable the display device to realize the narrow border design, and increase the product quality.

The display panel provided by an embodiment of the disclosure includes a display area and a peripheral area, where the display area has an opening structure, and the peripheral area includes a peripheral special shaped area fitting the opening structure. The display panel includes a plurality of first signal lines and a plurality of second signal lines extending to the peripheral special shaped area, and a first multiplexer, a second multiplexer and a plurality of main lines arranged in the peripheral special shaped area. Where the first multiplexer includes a plurality of first select circuits connected to the plurality of first signal lines in one-to-one correspondence. The second multiplexer includes a plurality of second select circuits connected to the plurality of second signal lines in one-to-one correspondence and arranged in one-to-one correspondence to the plurality of first select circuits. In the plurality of main lines, one end of each of the main lines is connected to at least two of the first select circuits and the other end is connected to the second select circuits, the second select circuits corresponding to the at least two of the first select circuits. Each of the first select circuits and the second select circuits is provided with switch elements configured to control the first signal lines and the second signal lines corresponding to the first signal lines to be turned on and turned off.

The embodiments of the disclosure, the plurality of first signal lines and the plurality of second signal lines are connected in the one-to-one correspondence by the first multiplexer, the plurality of main lines and the second multiplexer in the peripheral special shaped area. By controlling the switch timings of the switch elements of the first multiplexer and the second multiplexer, it is possible to make the different first signal lines and corresponding second signal lines connected to the same main line turn on in sequence according to the set timings. Compared with the related art, this design solution simplify the wiring structure of peripheral special shaped area of the display panel and reduce the wiring amount, and may thus reduce the width size of the peripheral special shaped area and then reduce the width size of the peripheral area of the display panel, enable the display device to realize the narrow border design, and increase the product quality.

An embodiment of the disclosure further provides a display device including the display panel described in any above-mentioned technical solutions. Since the width size of the peripheral special shaped area of the display panel is relatively small, the display device may realize the narrow border design, increase the screen occupation ratio, and make the display effect more outstanding. Then the display device has the higher product quality.

DETAILED DESCRIPTION OF THE EMBODIMENTS

In order to reduce the width size of the peripheral special shaped area of the display panel, enable the display device to realize the narrow border design, and increase the product quality, the embodiments of the disclosure provide a display panel and a display device. In order to make the objects, technical solutions and advantages clearer, the disclosure will be illustrated below in details with reference to the embodiments.

Figure 1:
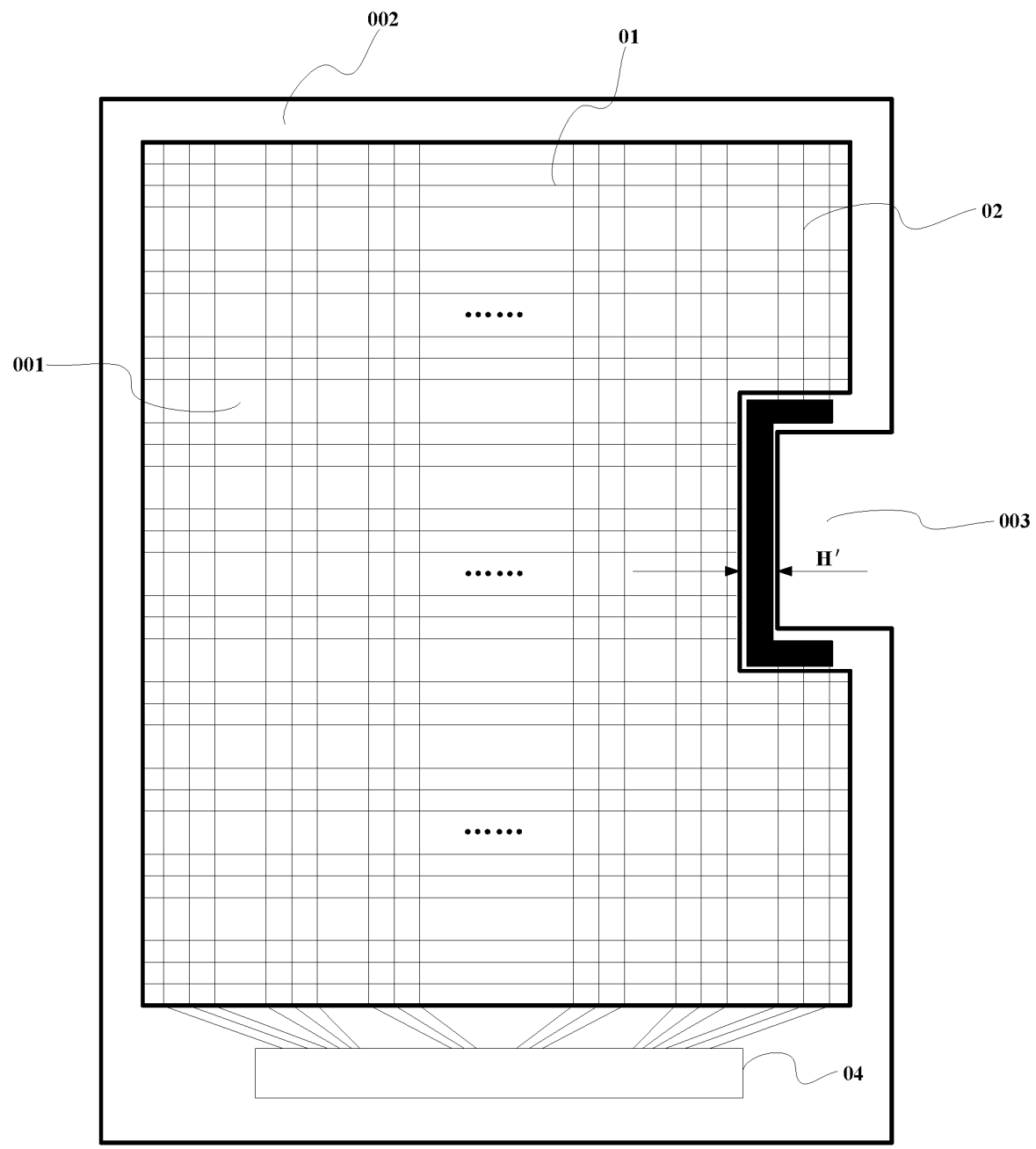
FIG. 1 is a schematic diagram of an existing special shaped display panel with a recess area.

As shown in FIG. 1, an existing special shaped display panel with a recess area 003 is divided into a display area 001 and a peripheral area 002 according to the presence or absence of the display function, where the display area 001 is provided with a pixel array (not shown in the figure) and the peripheral area is provided with a drive chip 04. The special shaped display panel includes a plurality of gate lines 01 and a plurality of data lines 02 arranged to intersect with but insulated from each other; due to the presence of the recess area 003, 240 data lines of the plurality of data lines 02 need to bypass the recess area 003, and this part of the wires bypassing the recess area 003 are accumulated closely in a peripheral special shaped area, corresponding to the recess area 003, with a width of about 1.2 mm; and moreover the gate drive circuits, the wires of the gate drive circuits, and the data timing signal lines and the like (not shown in the figure) of the special shaped display panel may also be arranged in the peripheral special shaped area corresponding to the recess area 003 described above, so that the design width, H', of this part is about 2 mm.

The drawback of the related art is that the width size of the peripheral area of the special shaped display panel is relatively large and thus the border size of the display device is relatively large, which goes against the current and future development tendency of the narrow border, thereby affecting the product quality of the display device.

Figure 2:
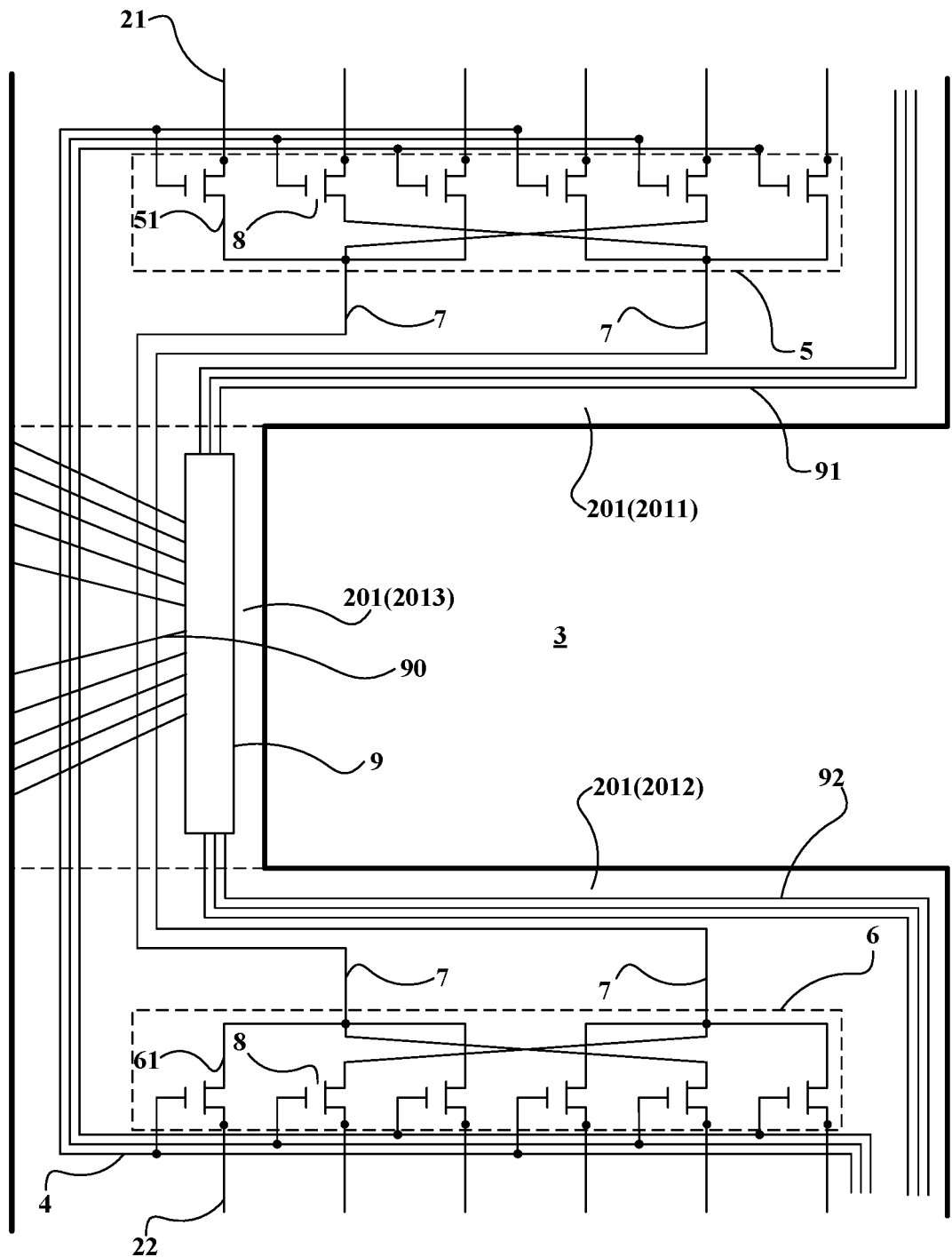
FIG. 2 is a schematic diagram of a circuit structure of the peripheral special shaped area of the display panel according to a first embodiment of the disclosure.
Figure 6:
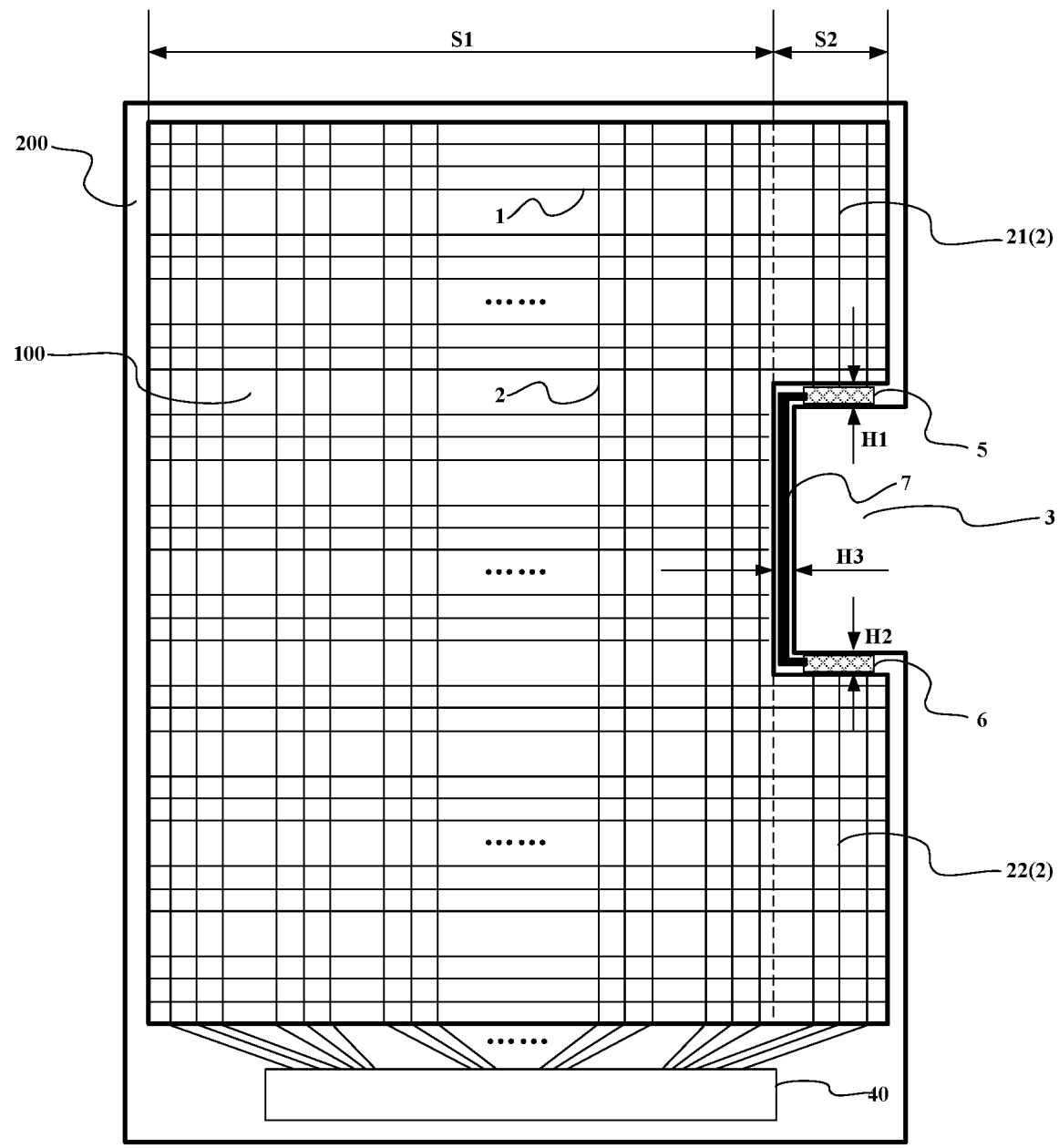
FIG. 6 is a schematic diagram of the display panel according to a fifth embodiment of the disclosure.

As shown in FIGS. 2 and 6, the display panel provided by an embodiment of the disclosure includes a display area 100 and a peripheral area 200, where the display area 100 has an opening structure 3, and the peripheral area 200 includes a peripheral special shaped area 201 fitting the opening structure 3. The display panel includes a plurality of first signal lines 21 and a plurality of second signal lines 22 extending to the peripheral special shaped area 201, and a first multiplexer 5, a second multiplexer 6 and a plurality of main lines 7 arranged in the peripheral special shaped area 201.

Where the first multiplexer 5 includes a plurality of first select circuits 51 connected to the plurality of first signal lines 21 in one-to-one correspondence.

The second multiplexer 6 includes a plurality of second select circuits 61 connected to the plurality of second signal lines 22 in one-to-one correspondence and arranged in one-to-one correspondence to the plurality of first select circuits 51.

In the plurality of main lines 7, one end of each main line 7 is connected to at least two first select circuits 51 and the other end is connected to the second select circuits 61 corresponding to the at least two first select circuits 51.

Each of the first select circuits 51 and the second select circuits 61 is provided with a switch element 8 configured to control the first signal lines 21 and the second signal lines 22 corresponding to the first signal lines 21 to be turned on and turned off.

In the embodiments of the disclosure, the display panel is different from the common rectangular display panel and is a special shaped display panel. The display area 100 of the display panel has the opening structure 3, so that the display area 100 cannot present as a continuous extended rectangle. Specifically the opening structure 3 may be a recess area located on an edge of the display area 100, and may also be an opening inside the display area 100. Since the peripheral area 200 surrounds the display area 100, the peripheral area 200 includes a portion bypassing the opening structure 3, this portion is referred as the peripheral special shaped area 201, of which the shape matches with the shape of the opening structure 3.

In the embodiments of the disclosure, "one-to-one correspondence" means: between A and B, each A corresponds to a unique B, and on the contrary, each B corresponds to a unique A. The "connection" relating to the circuit structure refers to the electrical connection between two objects, which may be a direct electrical connection and may also be an indirect electrical connection, e.g., the indirect electrical connection achieved by a via hole structure, or the like. It is possible for those ordinary skilled in the art to understand the specific meanings of the above-mentioned terms in the present application according to the specific situations.

In the technical solution of the embodiments of the disclosure, the plurality of first signal lines and the plurality of second signal lines are connected in the one-to-one correspondence by the first multiplexer, the plurality of main lines and the second multiplexer in the peripheral special shaped area. By controlling the switch timings of the switch elements of the first multiplexer and the second multiplexer, it may make the different first signal lines and corresponding second signal lines connected to the same main line turn on in sequence according to the set timings. Compared with the related art, this design solution simplifies the wiring structure of peripheral special shaped area of the display panel and reduces the wiring amount, and may thus reduce the width size of the peripheral special shaped area and then reduce the width size of the peripheral area of the display panel, enable the display device to realize the narrow border design, and increase the product quality.

As shown in FIG. 2, in an embodiment of the disclosure, the switch timings of the switch elements 8 of the first multiplexer 5 and the second multiplexer 6 are controlled by a plurality of timing signal lines 4. Specifically, the display panel further includes a plurality of timing signal lines 4 extending to the peripheral special shaped area 201, the switch elements 8 of the first select circuits 51 and the second select circuits 61 corresponding to the first select circuits 51 are connected to the timing signal lines 4 with same timing, the switch elements 8 of any two of the first select circuits 51 connected to the same main line 7 are connected to the timing signal lines 4 with different timings respectively, and the switch elements 8 of any two of the second select circuits 61 connected to the same main line 7 are connected to the timing signal lines 4 with different timings respectively. The plurality of timing signal lines 4 control the switch timings of the switch elements 8 of the first multiplexer 5 and the second multiplexer 6, so that the different first signal lines 21 and corresponding second signal lines 22 connected to the same main line 7 turn on in sequence according to the set timings to realize the signal transmission.

Figure 3A:
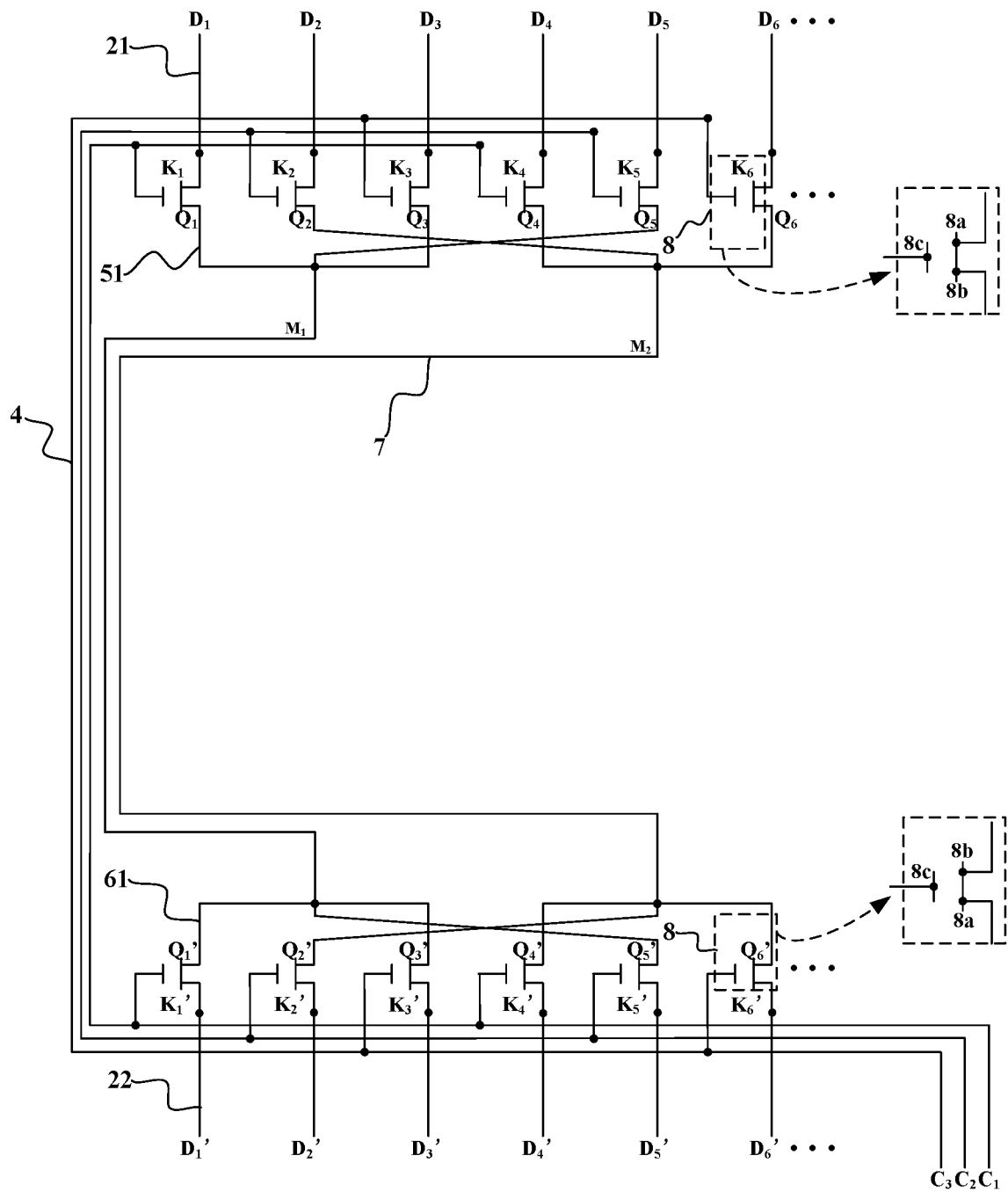
FIG. 3A is a schematic diagram of connection of the timing signal lines with the switch elements according to a second embodiment of the disclosure.

Under the premise of satisfying the above correspondences, the specific numbers of the first signal lines 21 (or the second signal lines 22), the main lines 7, and the timing signal lines 4 are not limited and may be designed according to the specific shape and size of the opening structure 3 correspondingly. As shown in FIG. 3A, this figure shows only six groups of the first signal lines 21 and the second signal lines 22, which does not represent the actual number.

Specifically: the first signal lines $D_1, D_2, D_3 \ldots$ are connected to the first select circuits $Q_1, Q_2, Q_3 \ldots$ in one-to-one correspondence, and the first select circuits $Q_1, Q_2, Q_3 \ldots$ are provided respectively with the switch elements $K_1$, $K_2$, $K_3$ ... in one-to-one correspondence; the second signal lines $D_1'$, $D_2'$, $D_3'$ ... are connected to the second select circuits $Q_1'$, $Q_2'$, $Q_3'$ ... in one-to-one correspondence, and the second select circuits $Q_1'$, $Q_2'$, $Q_3'$ ... are provided respectively with the switch elements $K_1'$, $K_2'$, $K_3'$ ...

One end of the main line $M_1$ is connected to the first select circuits $Q_1$, $Q_3$, $Q_5$ and the other end is connected to the second select circuits $Q_1'$, $Q_3'$, $Q_5'$; one end of the main line $M_2$ is connected to the first select circuits $Q_2$, $Q_4$, $Q_6$ and the other end is connected to the second select circuits $Q_2'$, $Q_4'$, $Q_6'$, and so on.

Figure 3B:
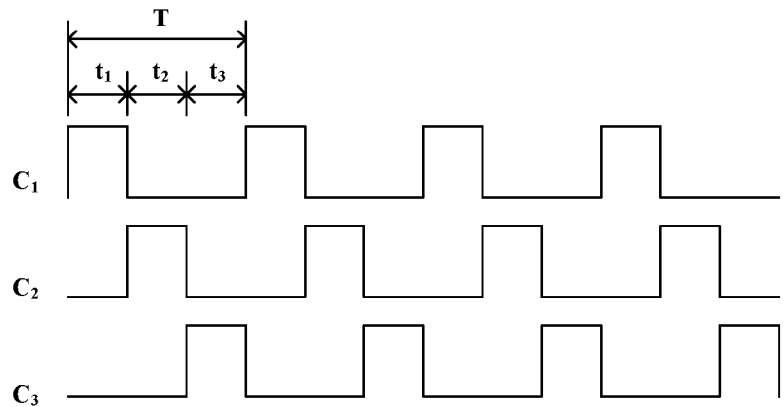
FIG. 3B is a schematic diagram of pulse signals of the timing signal lines according to the second embodiment of the disclosure.

The timing signal line $C_1$ is connected to the switch elements $K_1$, $K_4$, ..., $K_{1+3n}$ and the switch elements $K_1'$, $K_4'$, ..., $K_{1+3n}'$; the timing signal line $C_2$ is connected to the switch elements $K_2$, $K_5$, ..., $K_{2+3n}$ and the switch elements $K_2'$, $K_5'$, ..., $K_{2+3n}'$; the timing signal line $C_3$ is connected to the switch elements $K_3$, $K_6$, ..., $K_{3+3n}$ and the switch elements $K_3'$, $K_6'$, ..., $K_{3+3n}'$; where n is a natural number. The timing pulse signals of the timing signal lines $C_1$ to $C_3$ are shown in FIG. 3B.

During the first time period $t_1$ of the cycle T, the timing signal line $C_1$ outputs a pulse signal to the switch elements $K_1$, $K_4$, ..., $K_{1+3n}$ and the switch elements $K_1'$, $K_4'$, ..., $K_{1+3n}'$, the switch elements $K_1$, $K_4$, ..., $K_{1+3n}$ and the switch elements $K_1'$, $K_4'$, ..., $K_{1+3n}'$ turn on, the first signal lines $D_1$, $D_4$, ... $D_{1+3n}$ and respectively corresponding second signal lines $D_1'$, $D_4'$, ... $D_{1+3n}'$ are conductive, and the signals of the first signal lines $D_1$, $D_4$, ..., $D_{1+3n}$ are transmitted to the corresponding second signal lines $D_1'$, $D_4'$, ..., $D_{1+3n}'$ respectively.

During the second time period $t_2$ of the cycle T, the timing signal line $C_2$ outputs a pulse signal to the switch elements $K_2$, $K_5$, ..., $K_{2+3n}$ and the switch elements $K_2'$, $K_5'$, ..., $K_{2+3n}'$, the switch elements $K_2$, $K_5$, ..., $K_{2+3n}$ and the switch elements $K_2'$, $K_5'$, ..., $K_{2+3n}'$ turn on, the first signal lines $D_2$, $D_5$, ..., $D_{2+3n}$ and respectively corresponding second signal lines $D_2'$, $D_5'$, ..., $D_{2+3n}'$ are conductive, and the signals of the first signal lines $D_2$, $D_5$, ..., $D_{2+3n}$ are transmitted to the corresponding second signal lines $D_2'$, $D_5'$, ..., $D_{2+3n}'$ respectively.

During the third time period $t_3$ of the cycle T, the timing signal line $C_3$ outputs a pulse signal to the switch elements $K_3$, $K_6$, ..., $K_{3+3n}$ and the switch elements $K_3'$, $K_6'$, ..., $K_{3+3n}'$, the switch elements $K_3$, $K_6$, ..., $K_{3+3n}$ and the switch elements $K_3'$, $K_6'$, ..., $K_{3+3n}'$ turn on, the first signal lines $D_3$, $D_6$, ..., $D_{3+3n}$ and respectively corresponding second signal lines $D_3'$, $D_6'$, $D_{3+3n}'$ are conductive, and the signals of the first signal lines $D_3$, $D_6$, ..., $D_{3+3n}$ are transmitted to the corresponding second signal lines $D_3'$, $D_6'$, ..., $D_{3+3n}'$ respectively.

As shown in FIG. 6, the peripheral area 200 of the display panel is provided with a drive chip 40 and wires. The drive chip 40 is used as a signal output source for various signal lines including the first signal lines 21, the second signal lines 22, the timing signal lines 4 and the like in the display panel.

Figure 7A:
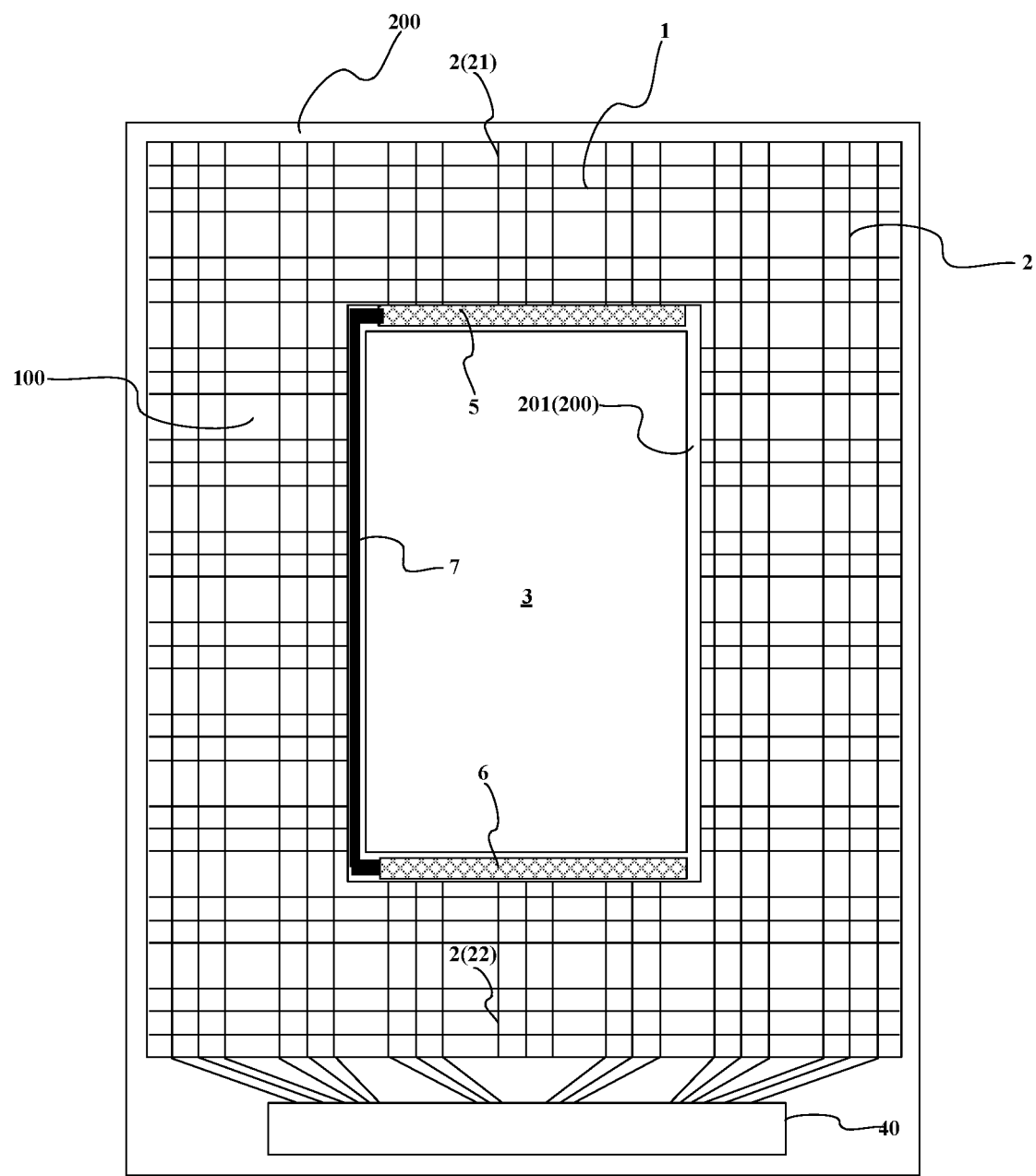
FIG. 7A is a schematic diagram of a display panel according to a sixth embodiment of the disclosure.

The specific position and shape of the opening structure 3 is not limited and may be designed according to the specific product demand of the display device. In order to bypass some function modules, e.g., web camera modules, sensor modules, or speaker modules or the like, around the frontal panel of the display device, as shown in FIG. 6, the opening structure 3 may be designed to be a recess area located on an edge of the display panel, where the shape of the recess area may be a rectangle as shown, and furthermore, it may also be another shape such as semicircle, polygon or arcu-ation. If the display device is an annular display device with a perspective window therein, as shown in FIG. 7A, the opening structure 3 may be designed to be an opening inside the display panel, where the shape of the opening may be a rectangle as shown and may also be another shape such as circle or polygon, which is not limited specifically here.

As shown in FIG. 2, in this embodiment, the opening structure 3 is a rectangular opening structure, and the peripheral special shaped area 201 includes a first side section 2011 and a second side section 2012 opposite to each other, and a third side section 2013 (divided by the dotted line in the figure) connected with the first side section and the second side section. The plurality of first signal lines 21 extend to the first side section 2011 and the first multiplexer 5 is arranged in the first side section 2011. The plurality of second signal lines 22 extend to the second side section 2012 and the second multiplexer 6 is arranged in the second side section 2012. The plurality of main lines 7 extend from the third side section 2013 to the first side section 2011 and the second side section 2012. The plurality of timing signal lines 4 extend to the first side section 2011 through the second side section 2012 and the third side section 2013.

Continuing to refer to FIG. 2, a portion of the plurality of timing signal lines 4 located in the third side section 2013 are arranged on a side of the plurality of main lines 7 close to the display area. The use of this design may reduce the wiring intersections of the timing signal lines 4 and the main lines 7, and may thus not only simplify the wiring structure of peripheral special shaped area 201 to further reduce the width size of the peripheral special shaped area 201, but also reduce the short-circuit badness due to the intersection jumper and be convenient for the wiring fabrication.

Continuing to refer to FIG. 2, the display panel further includes a drive circuit 9 arranged in the third side section 2013, and a portion of the plurality of main lines 7 located in the third side section 2013 are arranged on a side of the drive circuit 9 close to the display area. The drive circuit 9 is used to transmit a drive signal to the display area opposite to the third side section 2013, so the fan-out connecting lines 90 of the drive circuit 9 need be arranged proximate to the display area and occupy a certain width of the third side section 2013. The arrangement of the main lines 7 on the side of the drive circuit 9 close to the display area may take full advantage of the width of the third side section 2013 to make the wiring structure compact relatively, thereby reducing the width size of the peripheral special shaped area 201 to a larger degree.

Continuing to refer to FIG. 2, the display panel further includes a plurality of first drive circuit wires 91 extending to the third side section 2013 through the first side section 2011 and connected to the drive circuit 9, and a plurality of second drive circuit wires 92 extending to the third side section 2013 through the second side section 2012 and connected to the drive circuit 9. The first multiplexer 5 is arranged on a side of the plurality of first drive circuit wires 91 close to the display area, and the second multiplexer 6 is arranged on a side of the plurality of second drive circuit wires 92 close to the display area. The first drive circuit wires 91 and the second drive circuit wires 92 are connected to the drive chip arranged in the peripheral area of the display panel. Similarly, the use of this design may avoid the wiring intersections and thus reduce the wiring length of the first drive circuit wires 91 and the second drive circuit wires 92, which is not only beneficial to reducing the width size of the peripheral special shaped area 201 but also convenient for the wiring fabrication.

In the related art, as shown in FIG. 1, the width, H', of the peripheral area at the recess area 003 is about 2 mm. However, with the display panel of the structure of the above-mentioned embodiments of the disclosure, as shown in FIG. 6, taking the ratio of ⅓ of the numbers of the main lines to the first signal lines as an example, the width, H1, of the first side section and the width, H2, of the second side section are about 0.5 mm, thus 75% of the width size is saved compared to the related art. The width, H3, of the third side section is about 1.2 mm, thus 40% of the width size is saved compared to the related art, thereby reducing the width size of the peripheral special shaped area significantly and then reducing the width size of the peripheral area.

In the embodiments of the disclosure, the specific types of the first signal lines 21 and the second signal lines 22 are not limited.

As shown in FIG. 6, in this embodiment, the display panel includes: data lines 2 extending in a first direction and arranged sequentially in a second direction; and gate lines 1 extending in the second direction and arranged sequentially in the first direction, where the first signal lines 21 and the second signal lines 22 are the data lines 2.

Figure 8:
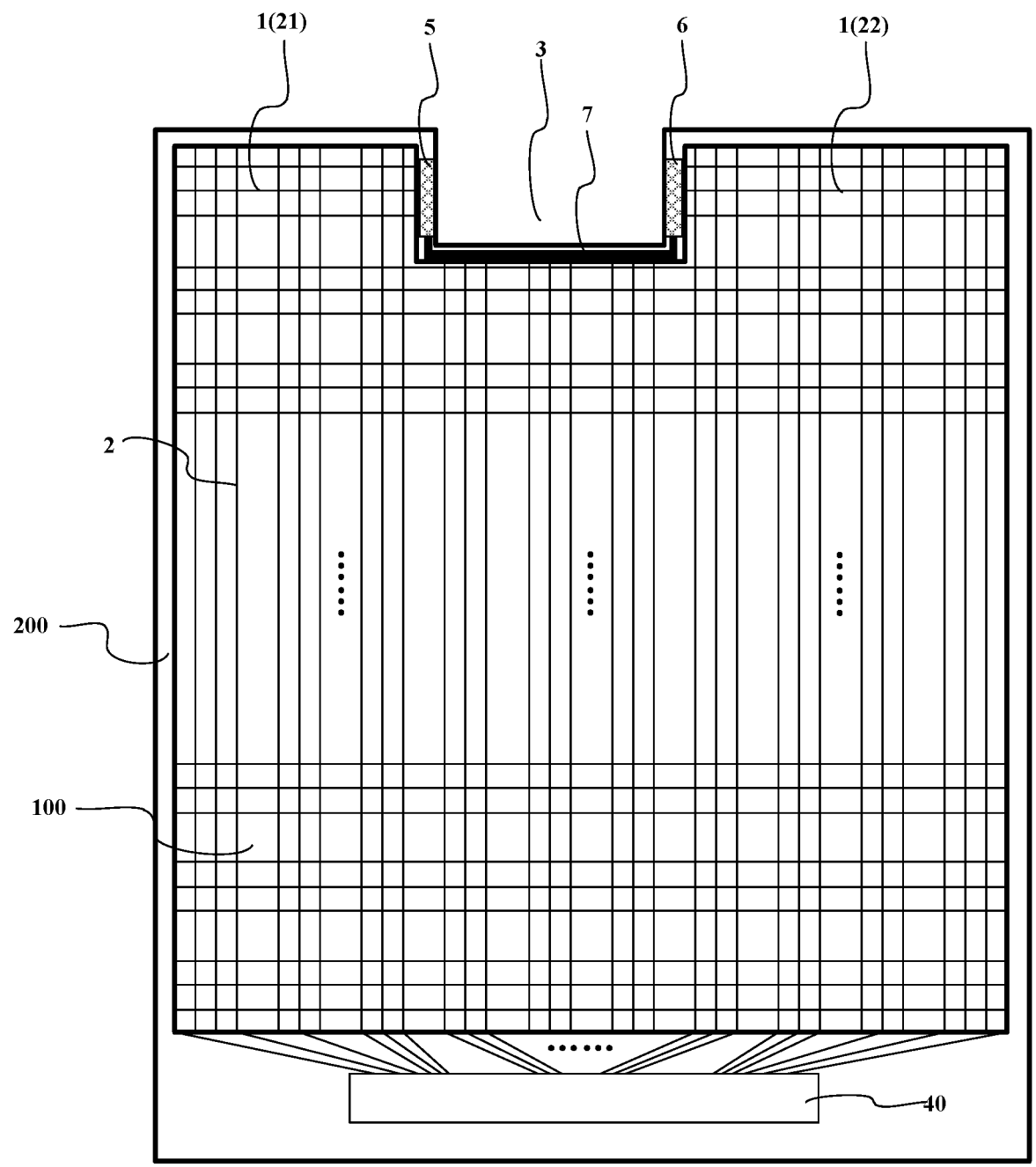
FIG. 8 is a schematic diagram of a display panel according to a seventh embodiment of the disclosure.

As shown in FIG. 8, in this embodiment, the display panel includes: data lines 2 extending in a first direction and arranged sequentially in a second direction; and gate lines 1 extending in the second direction and arranged sequentially in the first direction, where the first signal lines 21 and the second signal lines 22 are the gate lines 1.

Figure 9:
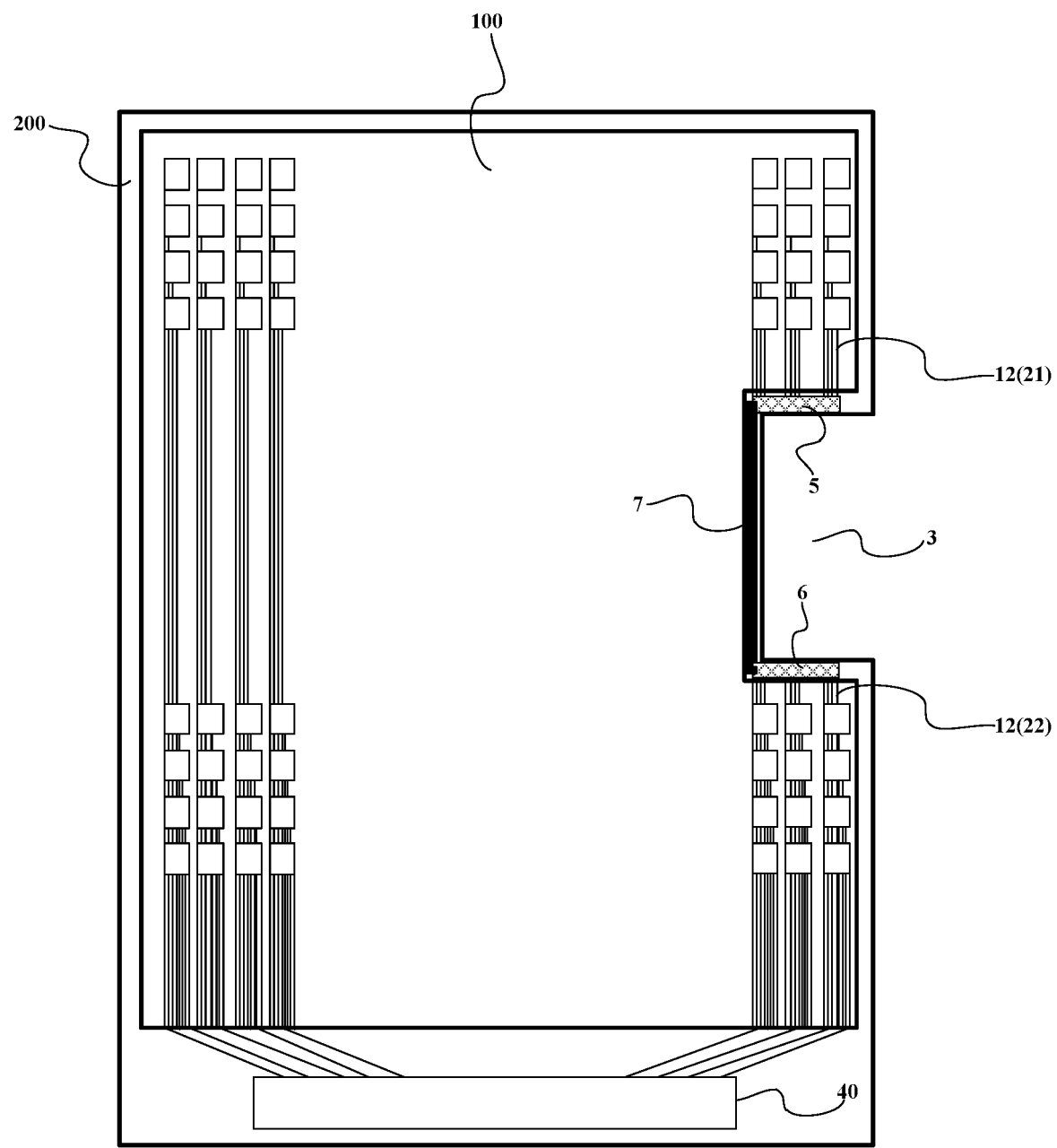
FIG. 9 is a schematic diagram of a display panel according to an eighth embodiment of the disclosure.

As shown in FIG. 9, in this embodiment, in addition to the gate lines and the data lines (not shown in the figure), the display panel further includes touch control lines 12 arranged in parallel to the data lines, where the first signal lines 21 and the second signal lines 22 are the touch control lines 12.

Figure 7B:
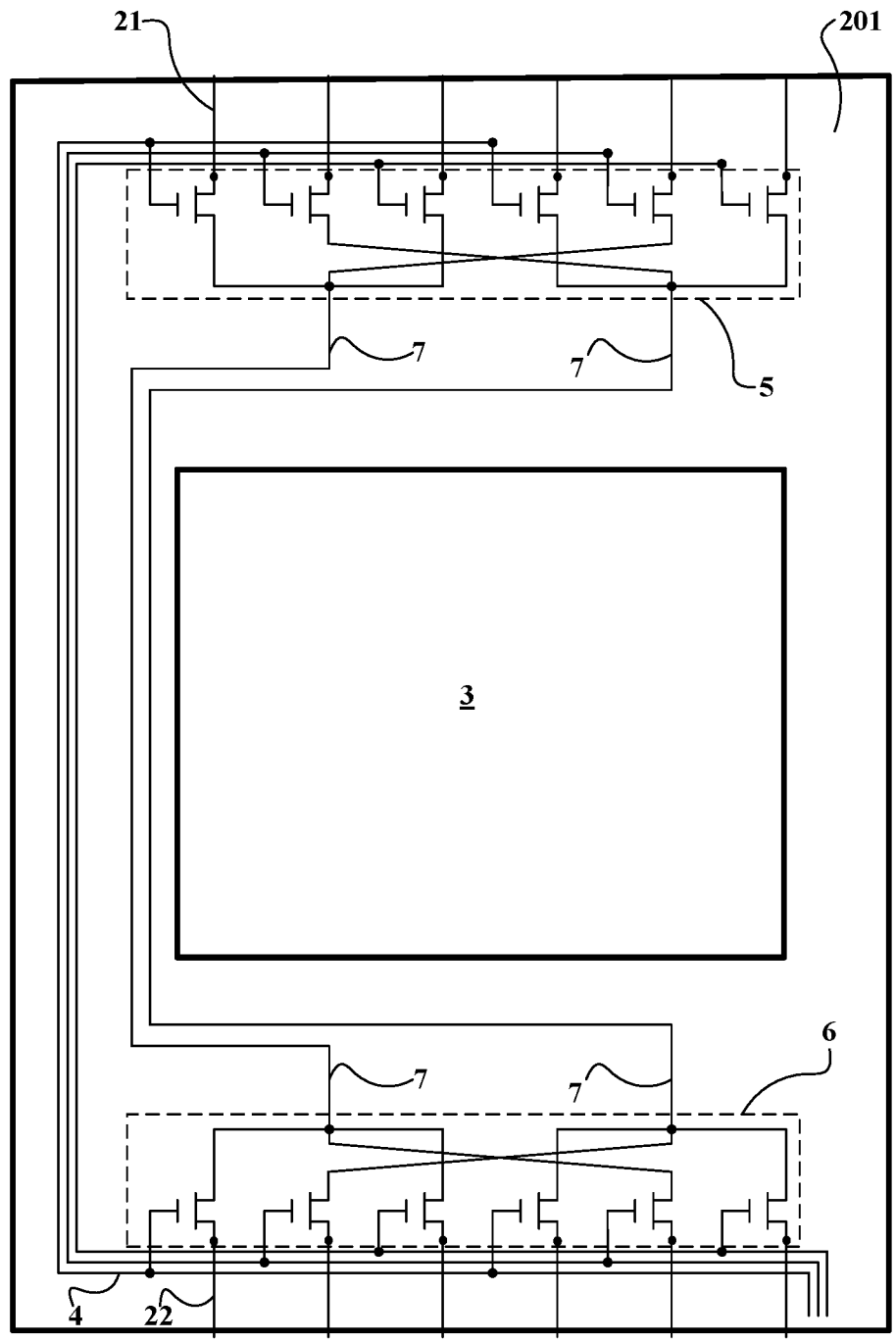
FIG. 7B is a schematic diagram of a circuit structure of the peripheral special shaped area of the display panel according to a sixth embodiment of the disclosure.

As shown in FIGS. 7a and 7b, in this embodiment, the opening structure 3 is an opening inside the display panel, and the first signal lines 21 and the second signal lines 22 are the data lines 2. The plurality of first signal lines 21 and the plurality of second signal lines 22 are connected in the one-to-one correspondence by the first multiplexer 5, the plurality of main lines 7 and the second multiplexer 6 in the peripheral special shaped area. In this embodiment, the gate lines 1 are also disconnected at the opening structure, and a gate drive circuit (not shown in the figure) may additionally be arranged in the peripheral area at the outer periphery of the display panel to transmit drive signals to the disconnected gate lines. Since the timing signal lines 4 need travel in the display area, the timing signal lines 4 may be arranged in parallel to the data lines 2.

In the embodiment of the disclosure, the number of the first select circuits 51 connected to one end of each main line 7 is at least 2, but the specific number is not limited and may be, for example, 2, 3, or 4. And the other end of each main line 7 is connected to the second select circuits 61 corresponding to the at least two first select circuits 51.

In the embodiments of the disclosure, the better range of the ratio of the numbers of the main lines 7 to the first signal lines 21 is ⅙ to ½, to thereby not only simplify the wiring structure of peripheral special shaped area 201 but also take into account the turn-on time requirement for the first signal lines 21 and the second signal lines 22 to meet the requirements for the display or touch control function of the display device.

In the display panel, each subpixel needs be connected to a gate line and a data line, a thin film transistor as the switch element is turned on by receiving a scan signa from the gate line, and the subpixel is driven by receiving a data signal from the data line to show a certain grayscale. Different subpixels are connected to different combinations of the gate lines and the data lines, so that each subpixel may emit light independently. A pixel unit generally includes red subpixels, green subpixels and bule subpixels. The subpixels of three colors are mixed in accordance with a certain grayscale, so that the pixel unit may show various colors from the macroscopical view. Therefore the macroscopic display of the display panel is in unit of pixel units.

For the regularly rectangular display panel or for the portion S1 where the extending of the column pixel units is continuous in the display panel as shown in FIG. 6, during the display cycle of a frame of pictures, the subpixels are driven in a way of scanning per row. When the thin film transistors of a row of subpixels are turned on, the data lines corresponding to these subpixels transmit the data signals to the row of subpixels simultaneously.

In the embodiment of the disclosure, as shown in FIG. 6, for the portion S2 where the extending of the column pixel units is spaced by the opening structure in the display panel, the subpixels of the pixel units are driven in a way of timing drive, that is, the subpixels in different colors of the pixel units are driven to display by turning on the corresponding first signal lines and second signal lines successively. Considering that the macroscopic display of the display panel is in unit of pixel units, thus in an optimal embodiment of the disclosure, as shown in FIG. 3A, when the first signal lines 21 and the second signal lines 22 are the data lines, one end of each main line 7 is connected to three first select circuits 51 and the other end is connected to the second select circuits 61 corresponding to the three first select circuits 51. The ratio of the number of the main lines 7 to the first signal lines 21 is ⅓. Furthermore, three first signal lines 21 are connected to their respectively corresponding second signal lines 22 by one main line 7, and the turn-on allocation time corresponding to the first signal lines 21 and the second signal lines 22 is sufficient, which may meet the charging time requirement of the pixels by the display device in high resolution, so that the display device has the better visual effect of the narrow border while it has the better image display quality.

For a liquid crystal display panel, in order to avoid the polarization of the liquid crystal molecules, the display panel is generally driven to display by the positive and negative voltages alternately. When a frame of pictures is updated, the polarity of the drive voltage of each subpixel is inverted. The column reversal mode has lower power consumption, and is a commonly-used polarity reversal mode at present. In order to realize the column reversal of the frame pictures of the liquid crystal display panel, in one embodiment of the disclosure, when the first signal lines 21 and the second signal lines 22 are the data lines, any two adjacent first select circuits 51 are connected to the different main lines 7 and any two adjacent second select circuits 61 are connected to the different main lines 7, where the electric properties of the first signal lines 21 and the second signal lines 22 corresponding to each main line 7 are the same. Take the embodiment shown in FIG. 3 as an example, namely, during the display cycle of a first frame of pictures, the first signal lines D1, D3, D5 . . . and the second signal lines D1', D3', D5' . . . transmit the positive voltage signals to the corresponding subpixels respectively, and the first signal lines D2, D4, D6 . . . and the second signal lines D2', D4', D6' . . . transmit the negative voltage signals to the corresponding subpixels respectively. And during the display cycle of a second frame of pictures, the first signal lines D1, D3, D5 . . . and the second signal lines D1', D3', D5' . . . transmit the negative voltage signals to the corresponding subpixels respectively, and the first signal lines D2, D4, D6 . . . and the second signal lines D2', D4', D6' . . . transmit the positive voltage signals to the corresponding subpixels respectively.

The specific type of the switch elements 8 is not limited. As shown in FIG. 3A, in one embodiment of the disclosure, the switch element 8 is an NMOS transistor, i.e., a transistor having a n-type metal-oxide semiconductor structure, which includes a first electrode 8a, a second electrode 8b and a control electrode 8c to control the conducting states of the first electrode 8a and the second electrode 8b. In the first select circuit 51: the first electrode 8a of the NMOS transistor is connected to the corresponding first signal line 21, the second electrode 8b of the NMOS transistor is connected to the corresponding main line 7, and the control electrode 8c of the NMOS transistor is connected to the corresponding timing signal line 4. In the second select circuit 61: the first electrode 8a of the NMOS transistor is connected to the corresponding second signal line 22, the second electrode 8b of the NMOS transistor is connected to the corresponding main line 7, and the control electrode 8c of the NMOS transistor is connected to the corresponding timing signal line 4. The NMOS transistor is selected as the switch element, of which the on-resistance is smaller and the manufacture cost is lower.

When the display panel is driven, the drive chip sends clock pulse signals to the timing signal lines 4 in sequence. The number of the timing signal lines 4 is designed to be in the proper range, which may ensure the turn-on time of the corresponding first signal lines 21 and second signal lines 22 and reduce the wiring amount in the peripheral special shaped area as much as possible, thereby reducing the width size of the peripheral special shaped area and then reducing the width size of the peripheral area.

As shown in FIGS. 3a and 3b, in one embodiment, the number of the timing signal lines 4 is 3. The connection relation of the timing signal lines $C_1$ to $C_3$ and the switch elements is as described above, and the repeated description thereof will be omitted here.

Figure 4:
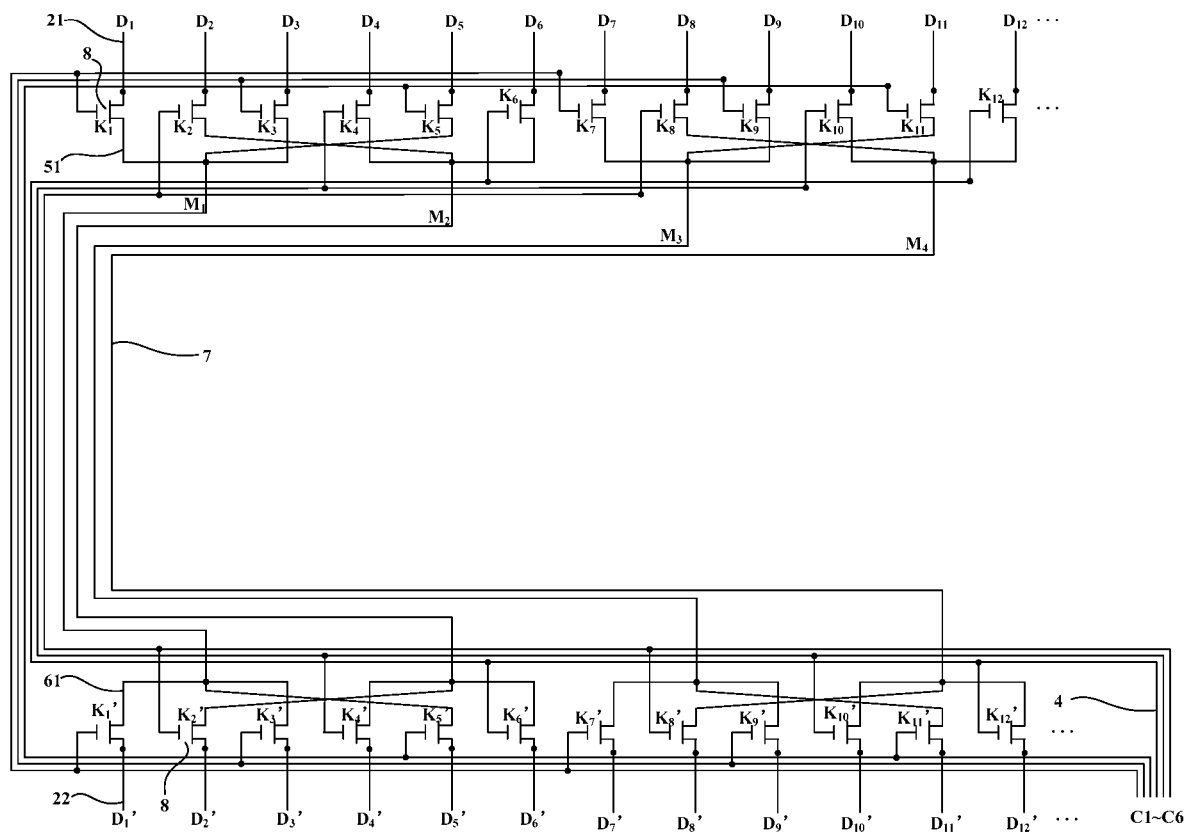
FIG. 4 is a schematic diagram of connection of the timing signal lines with the switch elements according to a third embodiment of the disclosure.

As shown in FIG. 4, in one embodiment, the number of the timing signal lines 4 is 6, namely, $C_1$ to $C_6$. Where the timing signal line $C_1$ is connected to the switch elements $K_1$, $K_7$, . . . , $K_{1+6n}$ and the switch elements $K_1'$, $K_7'$, . . . , $K_{1+6n}'$; the timing signal line $C_2$ is connected to the switch elements $K_3$, $K_9$, . . . , $K_{3+6n}$ and the switch elements $K_3'$, $K_9'$, . . . , $K_{3+6n}'$; the timing signal line $C_3$ is connected to the switch elements $K_5$, $K_{11}$, . . . , $K_{5+6n}$ and the switch elements $K_5'$, $K_{11}'$, . . . , $K_{5+6n}'$; the timing signal line $C_4$ is connected to the switch elements $K_6$, $K_{12}$, . . . , $K_{6+6n}$ and the switch elements $K_6'$, $K_{12}'$, . . . , $K_{6+6n}'$; the timing signal line $C_5$ is connected to the switch elements $K_4$, $K_{10}$, . . . , $K_{4+6n}$ and the switch elements $K_4'$, $K_{10}'$, . . . , $K_{4+6n}'$, and the timing signal line $C_6$ is connected to the switch elements $K_2$, $K_8$, . . . , $K_{2+6n}$ and the switch elements $K_2'$, $K_8'$, . . . , $K_{2+6n}'$.

Figure 5A:
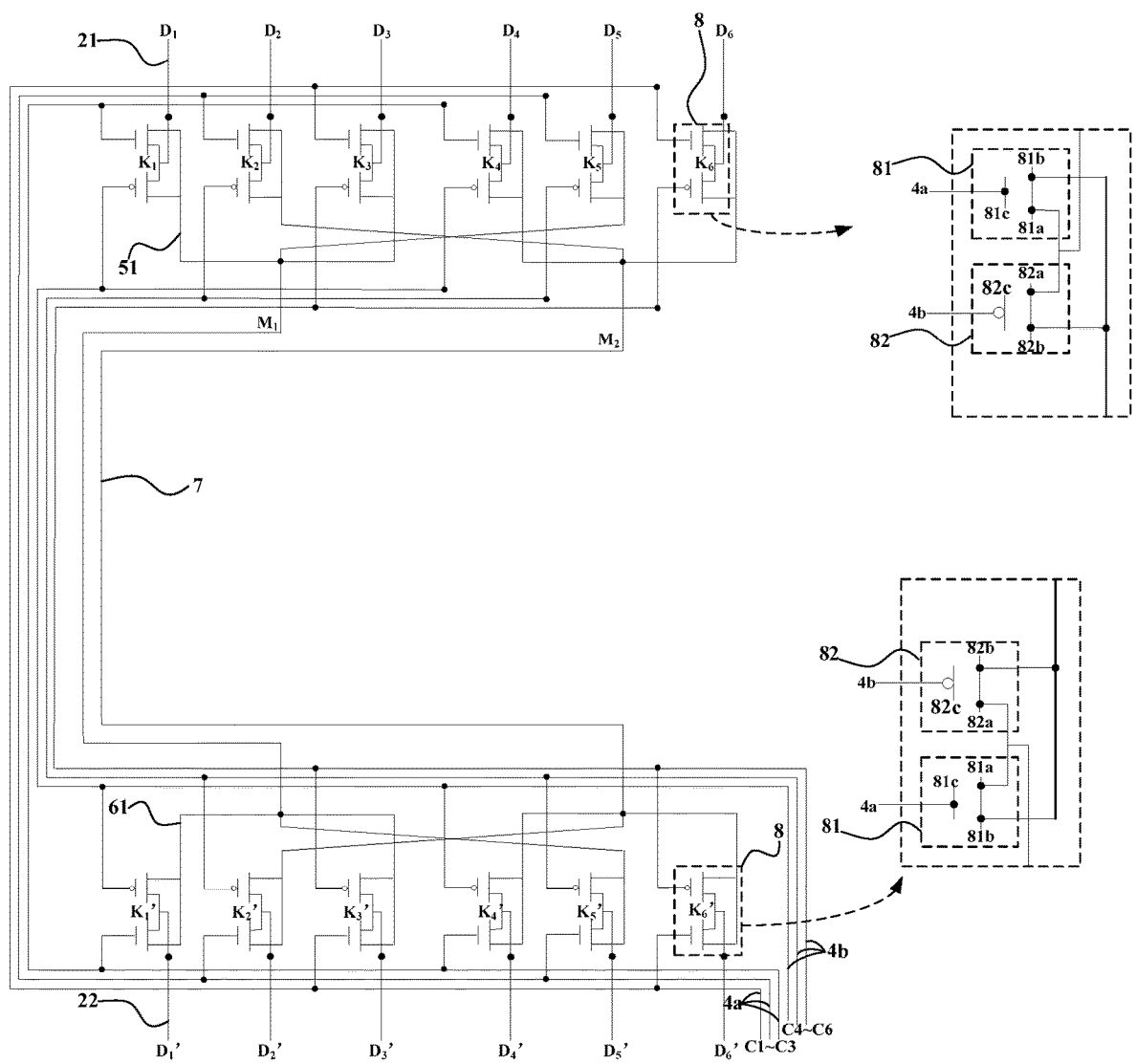
FIG. 5A is a schematic diagram of the connection of the timing signal lines with the switch elements according to a fourth embodiment of the disclosure.

As shown in FIG. 5A, in one embodiment of the disclosure, the plurality of timing signal lines include high-level timing signal lines 4a and low-level timing signal lines 4b arranged in one-to-one correspondence, and the corresponding timings of the high-level timing signal line 4a and low-level timing signal line 4b are the same. The switch element 8 includes an NMOS transistor 81 and a PMOS transistor 82, where the NMOS transistor 81 includes a first electrode 81a, a second electrode 81b and a first control electrode 81c to control the conducting states of the first electrode 81a and the second electrode 81b. The PMOS transistor 82 refers to an MOS transistor with an n-type substrate and a p-type channel which transports the current via the hole flow, and the PMOS transistor 82 includes a third electrode 82a, a fourth electrode 82b and a second control electrode 82c to control the conducting states of the third electrode 82a and the fourth electrode 82b. In the first select circuit 51: the first electrode 81a of the NMOS transistor 81 and the third electrode 82a of the PMOS transistor 82 are connected to the corresponding first signal line 21, the second electrode 81b of the NMOS transistor 81 and the fourth electrode 82b of the PMOS transistor 82 are connected to the corresponding main line 7, the first control electrode 81c of the NMOS transistor 81 is connected to the corresponding high-level timing signal line 4a, and the second control electrode 82c of the PMOS transistor 82 is connected to the corresponding low-level timing signal line 4b. In the second select circuit 61: the first electrode 81a of the NMOS transistor 81 and the third electrode 82a of the PMOS transistor 82 are connected to the corresponding second signal line 22, the second electrode 81b of the NMOS transistor 81 and the fourth electrode 82b of the PMOS transistor 82 are connected to the corresponding main line 7, the first control electrode 81c of the NMOS transistor 81 is connected to the corresponding high-level timing signal line 4a, and the second control electrode 82c of the PMOS transistor 82 is connected to the corresponding low-level timing signal line 4b. The switch element using this structure is also called the CMOS transistor. Since the NMOS transistor 81 and the PMOS transistor 82 receive the high-level timing signal line 4a and the low-level timing signal line 4b respectively, the conduction currents of the NMOS transistor 81 and the PMOS transistor 82 have the complementary property. Thus the CMOS transistor has a conduction current which is linear as a whole, and has the advantages of the low power consumption, a wide range of operating voltages, the large logic swing, the strong capacity of resisting disturbance, the high input impedance, the good stability with temperature, the strong capacity of resisting radiation, the good controllability and the like.

Figure 5B:
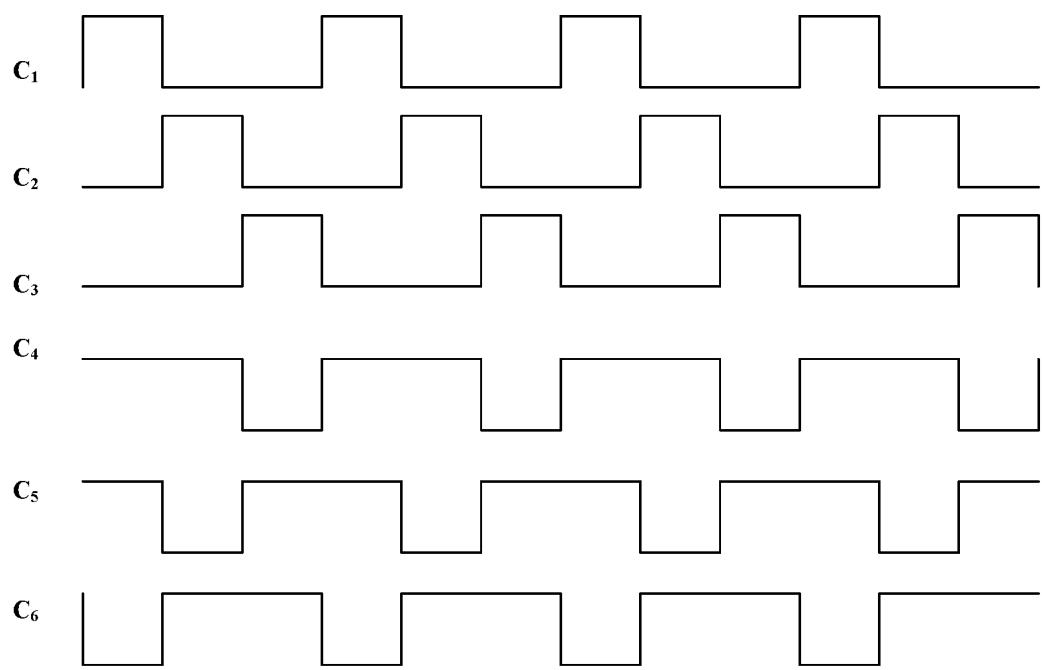
FIG. 5B is a schematic diagram of pulse signals of the timing signal lines according to a fourth embodiment of the disclosure.

As shown in FIG. 5a, in this embodiment, the number of the timing signal lines 4 is 6, and $C_1$ to $C_3$ are the high-level timing signal lines and $C_4$ to $C_6$ are the low-level timing signal lines. The timing signal line $C_1$ is connected to the first control electrodes of the NMOS transistors of the switch elements $K_3$, $K_6$, . . . , $K_{3+3n}$ and the first control electrodes of the NMOS transistors of the switch elements $K_3'$, $K_6'$, . . . , $K_{3+3n}'$. The timing signal line $C_2$ is connected to the first control electrodes of the NMOS transistors of the switch elements $K_2$, $K_5$, . . . , $K_{2+3n}$ and the first control electrodes of the NMOS transistors of the switch elements $K_2'$, $K_5'$, . . . , $K_{2+3n}'$. The timing signal line $C_3$ is connected to the first control electrodes of the NMOS transistors of the switch elements $K_1$, $K_4$, . . . , $K_{1+3n}$ and the first control electrodes of the NMOS transistors of the switch elements $K_1'$, $K_4'$, . . . , $K_{1+3n}'$. The timing signal line $C_4$ is connected to the second control electrodes of the PMOS transistors of the switch elements $K_1$, $K_4$, . . . , $K_{1+3n}$ and the second control electrodes of the PMOS transistors of the switch elements $K_1'$, $K_4'$, . . . , $K_{1+3n}'$. The timing signal line $C_5$ is connected to the second control electrodes of the PMOS transistors of the switch elements $K_2$, $K_5$, . . . , $K_{2+3n}$ and the second control electrodes of the PMOS transistors of the switch elements $K_2'$, $K_5'$, . . . , $K_{2+3n}'$. And the timing signal line $C_6$ is connected to the second control electrodes of the PMOS transistors of the switch elements $K_3$, $K_6$, . . . , $K_{3+3n}$ and the second control electrodes of the PMOS transistors of the switch elements $K_3'$, $K_6'$, ..., $K_{3+3n}'$. The timing pulse signals of the timing signal lines $C_1$ to $C_6$ are shown in FIG. 5B.

Figure 10:
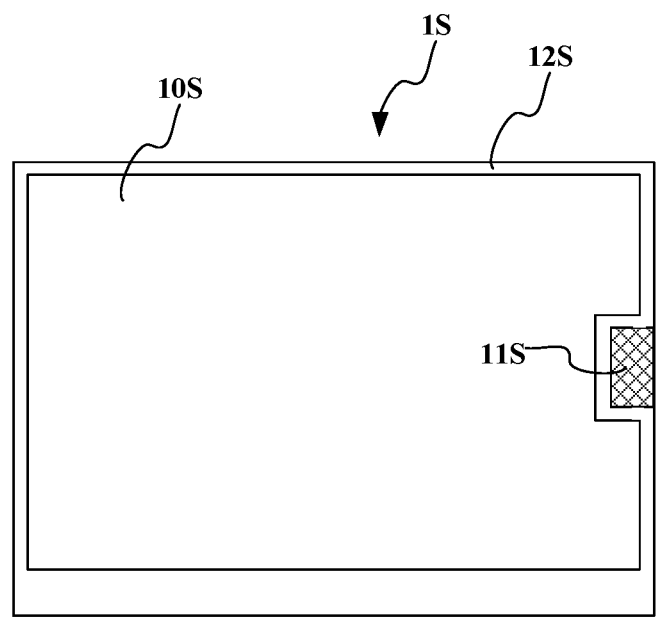
FIG. 10 is a schematic diagram of a display device according to an embodiment of the disclosure.

As shown in FIG. 10, an embodiment of the disclosure further provides a display device 1S including the display panel 10S described in any above-mentioned technical solutions. The opening structure of the display panel 10S bypasses the function modules 11S such as a speaker. Since the width size of the peripheral area of the display panel 10S is relatively small, the width of the border 12S of the display device may be designed to be relatively small, to thereby increase the screen occupation ratio and make the display effect more outstanding. Then the display device has the higher product quality. The specific product type of the display device is not limited, which may be, for example, a display, a flat panel TV set, a tablet, a mobile phone, an advertising presentation screen, an information indicating screen, an on-vehicle display screen, a smartwatch, a smart bracelet, VR/AR glasses or the like.

Evidently those skilled in the art may make various modifications and variations to the disclosure without departing from the spirit and scope of the disclosure. Thus the disclosure is also intended to encompass these modifications and variations therein as long as these modifications and variations come into the scope of the claims of the disclosure and their equivalents.

What is claimed is:

1. A display panel, comprising:
   a display area and a peripheral area, the display area having an opening structure, the peripheral area comprising a peripheral special shaped area fitting the opening structure, wherein the display panel comprises a plurality of first signal lines and a plurality of second signal lines extending to the peripheral special shaped area, and a first multiplexer, a second multiplexer and a plurality of main lines, wherein the first multiplexer, the second multiplexer and the plurality of main lines are arranged in the peripheral special shaped area, wherein:
   the first multiplexer comprises a plurality of first select circuits directly connected to the plurality of first signal lines in one-to-one correspondence;
   the second multiplexer comprises a plurality of second select circuits directly connected to the plurality of second signal lines in one-to-one correspondence and arranged in one-to-one correspondence to the plurality of first select circuits;
   in the plurality of main lines, a first end of each of the main lines is directly connected to at least two of the first select circuits and a second end is directly connected to at least two of the second select circuits, with the at least two of the second select circuits arranged in one-to-one correspondence to the at least two of the first select circuits; and
   each of the first select circuits and the second select circuits is provided with switch elements configured to control the first signal lines and the second signal lines corresponding to the first signal lines to be turned on and turned off.

2. The display panel of claim 1, wherein the display panel further comprises a plurality of timing signal lines extending to the peripheral special shaped area, the switch elements of the first select circuits and the second select circuits corresponding to the first select circuits are connected to the timing signal lines with same timing, the switch elements of any two of the first select circuits connected to a same main line are connected to the timing signal lines with different timings respectively, and the switch elements of any two of the second select circuits connected to a same main line are connected to the timing signal lines with different timings respectively.

3. The display panel of claim 2, wherein the opening structure is a rectangular opening structure, and the peripheral special shaped area comprises a first side section and a second side section opposite to each other, and a third side section connected with the first side section and the second side section;
   the plurality of first signal lines extend to the first side section and the first multiplexer is arranged in the first side section;
   the plurality of second signal lines extend to the second side section and the second multiplexer is arranged in the second side section;
   the plurality of main lines extend from the third side section to the first side section and the second side section; and
   the plurality of timing signal lines extend to the first side section through the second side section and the third side section.

4. The display panel of claim 3, wherein a portion of the plurality of timing signal lines located in the third side section are arranged on a side of the plurality of main lines close to the display area.

5. The display panel of claim 3, wherein the display panel further comprises a drive circuit arranged in the third side section, and a portion of the plurality of main lines located in the third side section are arranged on a side of the drive circuit close to the display area.

6. The display panel of claim 5, wherein:
   the display panel further comprises a plurality of first drive circuit wires extending to the third side section through the first side section and connected to the drive circuit, and a plurality of second drive circuit wires extending to the third side section through the second side section and connected to the drive circuit; and
   the first multiplexer is arranged on a side of the plurality of first drive circuit wires close to the display area, and the second multiplexer is arranged on a side of the plurality of second drive circuit wires close to the display area.

7. The display panel of claim 2, wherein the display panel comprises:
   data lines extending in a first direction and arranged sequentially in a second direction;
   gate lines extending in the second direction and arranged sequentially in the first direction; and
   touch control lines arranged in parallel to the data lines;
   wherein the first signal lines and the second signal lines are the data lines; or the first signal lines and the second signal lines are the gate lines; or the first signal lines and the second signal lines are the touch control lines.

8. The display panel of claim 7, wherein if the first signal lines and the second signal lines are the data lines, the first end of each of the main lines is connected to three of the first select circuits and the second end is connected to the second select circuits, the second select circuits corresponding to the three of the first select circuits.

9. The display panel of claim 7, wherein any adjacent two of the first select circuits are connected to the different main lines and any adjacent two of the second select circuits are connected to the different main lines when the first signal lines and the second signal lines are the data lines, wherein electric properties of the first signal lines and the second signal lines corresponding to each of the main lines are the same.

10. The display panel of claim 7, wherein:
the switch elements are NMOS transistors, the NMOS transistors each comprises a first electrode, a second electrode and a control electrode to control conducting states of the first electrode and the second electrode;
in the first select circuit: the first electrode of each NMOS transistor is connected to the corresponding first signal line, the second electrode of each NMOS transistor is connected to the corresponding main line, and the control electrode of each NMOS transistor is connected to the corresponding timing signal line; and
in the second select circuit: the first electrode of each NMOS transistor is connected to the corresponding second signal line, the second electrode of the NMOS transistor is connected to the corresponding main line, and the control electrode of the NMOS transistor is connected to the corresponding timing signal line.

11. The display panel of claim 10, wherein the number of the timing signal lines is 3.

12. The display panel of claim 7, wherein,
the plurality of timing signal lines comprise high-level timing signal lines and low-level timing signal lines arranged in one-to-one correspondence, and corresponding timings of high-level timing signal line and low-level timing signal line are same;
each of the switch elements comprises an NMOS transistor and a PMOS transistor, where the NMOS transistor comprises a first electrode, a second electrode and a first control electrode to control conducting states of the first electrode and the second electrode, and the PMOS transistor comprises a third electrode, a fourth electrode and a second control electrode to control conducting states of the third electrode and the fourth electrode;
in the first select circuit: the first electrode of each NMOS transistor and the third electrode of each PMOS transistor are connected to the corresponding first signal line, the second electrode of each NMOS transistor and the fourth electrode of each PMOS transistor are connected to the corresponding main line, the first control electrode of each NMOS transistor is connected to the corresponding high-level timing signal line, and the second control electrode of the PMOS transistor is connected to the corresponding low-level timing signal line; and
in the second select circuit: the first electrode of each NMOS transistor and the third electrode of each PMOS transistor are connected to the corresponding second signal line, the second electrode of each NMOS transistor and the fourth electrode of each PMOS transistor are connected to the corresponding main line, the first control electrode of each NMOS transistor is connected to the corresponding high-level timing signal line, and the second control electrode of each PMOS transistor is connected to the corresponding low-level timing signal line.

13. The display panel of claim 12, wherein the number of the timing signal lines is 6.

14. The display panel of claim 1, wherein a ratio of the number of the main lines to the first signal lines is $1/6$ to $1/2$.

15. The display panel of claim 1, wherein the opening structure is a recess area located on an edge of the display panel, where a shape of the recess area comprises rectangle, semicircle, polygon or arcuation.

16. The display panel of claim 1, wherein the opening structure is an opening inside the display panel, wherein a shape of the opening comprises rectangle, circle or polygon.

17. A display device, comprising:
a display panel, the display panel comprising a display area and a peripheral area, the display area having an opening structure, the peripheral area comprising a peripheral special shaped area fitting the opening structure, wherein the display panel comprises a plurality of first signal lines and a plurality of second signal lines extending to the peripheral special shaped area, and a first multiplexer, a second multiplexer and a plurality of main lines, wherein the first multiplexer, the second multiplexer and the plurality of main lines are arranged in the peripheral special shaped area, wherein:
the first multiplexer comprises a plurality of first select circuits directly connected to the plurality of first signal lines in one-to-one correspondence;
the second multiplexer comprises a plurality of second select circuits directly connected to the plurality of second signal lines in one-to-one correspondence and arranged in one-to-one correspondence to the plurality of first select circuits;
in the plurality of main lines, a first end of each of the main lines is directly connected to at least two of the first select circuits and a second end is directly connected to at least two of the second select circuits, with the at least two of the second select circuits arranged in one-to-one correspondence to the at least two of the first select circuits; and
each of the first select circuits and the second select circuits is provided with switch elements configured to control the first signal lines and the second signal lines corresponding to the first signal lines to be turned on and turned off.

* * * * *